United States Patent [19]
Middleton et al.

[11] 4,453,208
[45] Jun. 5, 1984

[54] APPARATUS FOR CONTROLLING THE TIME SEQUENCED ENERGIZATION OF A MEMORY UNIT

[75] Inventors: Michael C. Middleton; Thomas J. Hernandez, both of Phoenix, Ariz.

[73] Assignee: Honeywell Information Systems Inc., Phoenix, Ariz.

[21] Appl. No.: 355,817

[22] Filed: Mar. 8, 1982

[51] Int. Cl.³ .............................................. G11C 7/00
[52] U.S. Cl. .................................. 364/140; 364/141; 364/900; 365/226; 365/228
[58] Field of Search ........ 364/140, 141, 200 MS File, 364/ 900 MS File; 365/226, 227, 228, 229

[56] References Cited

U.S. PATENT DOCUMENTS 4,151,611  4/1979  Sugawara et al. ................... 365/227

*Primary Examiner*—Jerry Smith
*Assistant Examiner*—Allen MacDonald
*Attorney, Agent, or Firm*—Lockwood D. Burton; W. W. Holloway, Jr.; L. J. Marhoefer

[57] ABSTRACT

A sequencer control for controlling the time sequencing of the energization of controlled elements includes a microprocessor unit. A large number of input lines and output lines are uniquely multiplexed into a relatively small number of I/O terminals on the microprocessor. The multiplexing, the sequencing and all of the delays are effectively controlled by the microprocessor.

8 Claims, 4 Drawing Figures

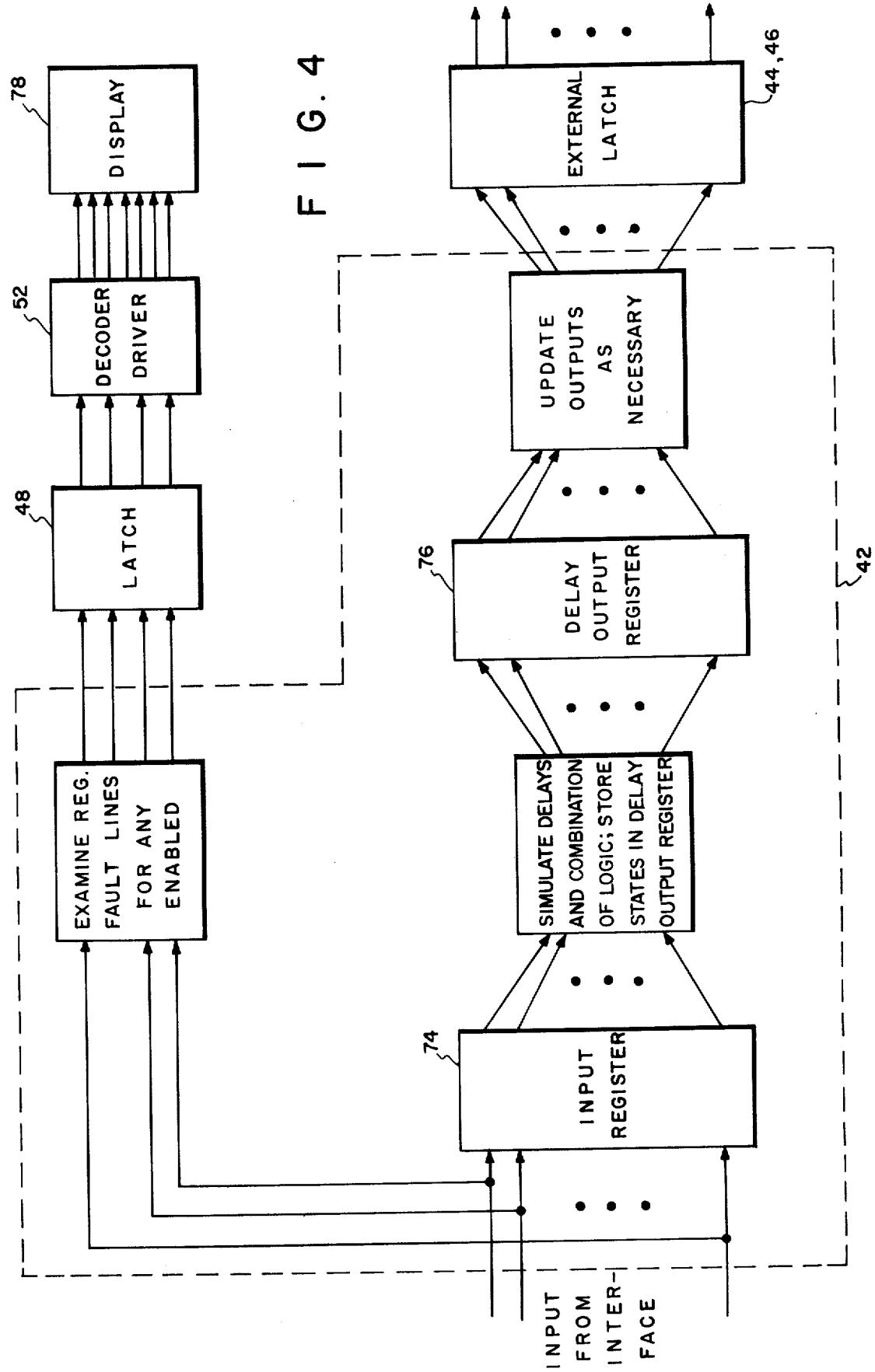

APPARATUS FOR CONTROLLING THE TIME SEQUENCED ENERGIZATION OF A MEMORY UNIT

BACKGROUND OF THE INVENTION

The present invention relates to computer apparatus. More particularly, it relates to power sequencing control for the memory of a computer.

The memory units in computer apparatus are energized by power sources representing different energy or voltage levels. Because of the intricacies of the memory units, these several power sources may not be simultaneously applied to the memory units nor may they be simultaneously removed from the memory units. Rather, the power units must be applied in a predetermined sequence and after predetermined delays. Similarly, the removal of power from the memory unit must also follow a comparable sequence. Upon the detection of certain faults in the various power sources, the power must be removed from the memory units again in a predetermined sequence with predetermined delays therein. Heretofore, such sequencing has been accomplished through dedicated and discrete circuitry for each of the power signal lines with discrete RC networks constituting individual delay means. Such structures were characterized by being relatively expensive both in the number of parts and in the time consumed in assembling such parts, as well as being subject to failure in any of a large number of parts.

SUMMARY OF THE INVENTION

It is, accordingly, an object of the present invention, to provide an improved sequencing control arrangement which obviates the foregoing shortcomings.

It is another object of the present invention to provide an improved sequencing control arrangement which is characterized in requiring fewer individual parts.

It is a further object of the present invention to provide an improved sequencing control arrangement as set forth which is further characterized in exhibiting an improved flexibility relative to the foregoing circuitry.

In accomplishing these and other objects, there has been provided, in accordance with the present invention, a sequencer control arrangement for controlling the sequencing and timing of the energization of controlled elements which arrangement includes a microprocessor unit. A large number of input lines and output lines are uniquely multiplexed into a relatively small number of I/O port terminals on the microprocessor. The multiplexing, the sequencing, and all of the delays are effectively controlled by the microprocessor.

BRIEF DESCRIPTION OF THE DRAWINGS

A better understanding of the present invention may be had from the following detailed description when read in the light of the accompanying drawings in which:

FIG. 4 is a flow chart illustrating the flow of information in accordance with the present invention.

DETAILED DESCRIPTION

Figure 1:
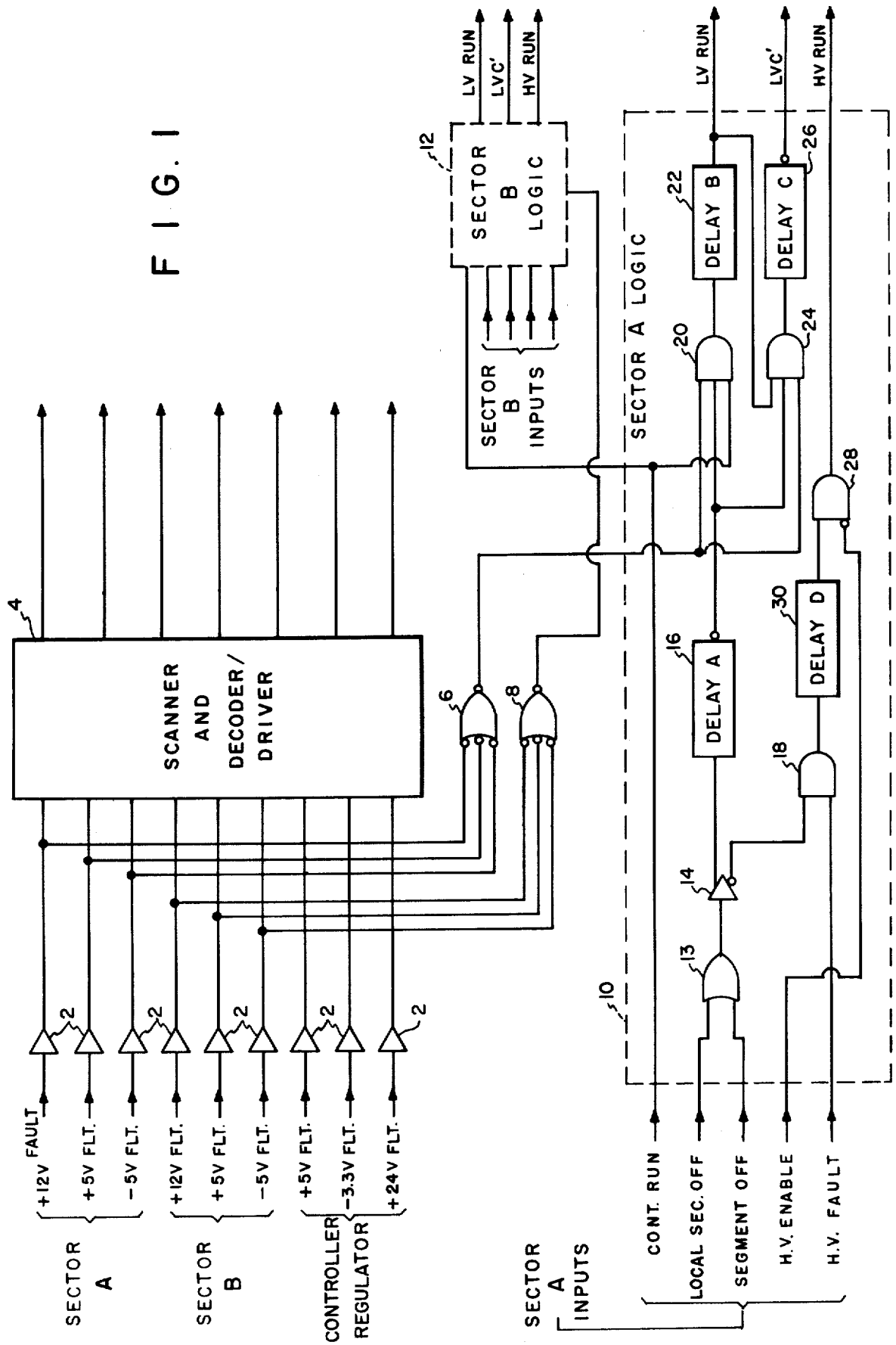
FIG. 1 is a schematic block diagram illustrating the logic functions simulated by the present invention.

Referring now to the drawings in more detail, there is shown in FIG. 1 a schematic representation of the logical functions which are to be simulated in accordance with the present invention. Typically in a computer system of the order here referenced, the main memory is divided into a first and second sector which herein will be identified as Sector A and Sector B. Each of these sectors is provided with a low voltage energy source, e.g. 5 volts, and a high voltage energy source, e.g. 12 volts. Because of the nature of the memory structure, these two energy sources may not be applied to the memory units simultaneously or haphazardly. The low voltage source must be applied first and, when that is established, after a predetermined delay the high voltage source may be applied. Similarly, when it is necessary to power-down the memory in order to avoid damaging the memory structure, the high voltage source must be first removed from the memory and then the low voltage source removed. Heretofore, the control of the application of the energizing voltages to the memory has been accomplished by discrete circuitry. In the event of a fault in one or more of the power source regulators, the energy must be removed from the memories or at least the sector involved in accordance with the established program. Additionally, it is highly desirable to be able to identify which power supply regulator has failed. To this end, sensing means associated with each of the regulator transmit signals indicative of the failing regulator. These signals are scanned and supplied to a decoder which, in turn, energizes a seven-segment display identifying which of the several units of the power supply regulation has been detected as failing.

In the exemplary embodiment, there are nine such fault indication lines, each representative of the condition of a separate regulator. In FIG. 1 these are identified as a +12 volt fault line, a +5 volt fault line and a −5 fault line, each associated with Sector A. Similarly there is illustrated a +12 volt fault line, a +5 volt fault line and a −5 volt fault line, each associated with Sector B. Additionally there is a +5 volt fault line, a −3.3 volt fault line and a +24 volt fault line associated with a controller regulator. As noted, these fault lines are exemplary; accordingly, the sources of these fault lines is not a part of the present invention and need not be discussed in detail herein. Each of these lines is applied to the input of an associated buffer amplifier 2, the outputs of which are applied to several input terminals of a scanner decoder/driver 4. The output terminals of the decoder/driver are applied to energize selectively the seven segments of a seven-segment display unit.

Additionally, the fault lines associated with the Sector A and Sector B are also applied to logic circuitry for controlling the application of the power supply control signals to the memory sectors. Thus the fault lines associated with Sector A are applied to the three input terminals of a negative OR gate 6. Similarly, the fault lines associated with Sector B are applied to the three input terminals of a negative OR gate 8. The output of the gate 6 is applied as one input to a Sector A logic circuit 10 while the output of the gate 8 is applied as one input to a Sector B logic circuit 12. The structure of the Sector B logic circuit 12 is, for all intents and purposes, identical to the structure of the Sector A logic circuit 10. Accordingly, the description of the Sector A logic circuit will also serve as a description of the Sector B logic circuit.

In the exemplary embodiment, in addition to the fault lines previously mentioned, there are five additional signals input to the Sector A logic circuit 10. These include a CONTROLLER RUN signal which is applied as an input signal to both the Sector A logic circuit and the Sector B logic circuit. Also provided are a LOCAL SECTOR OFF signal, a SEQUENCER OFF signal, a HIGH VOLTAGE ENABLE signal and a HIGH VOLTAGE FAULT signal. Again the source of these signals is not a part of the present invention and is not described in detail herein. The LOCAL SECTOR OFF and the SEQUENCER OFF signals are signals indicative that the local sector and/or the sequencer are to be turned off. These two signals are applied as input to an OR gate 13, the output of which is connected to the input of a buffer amplifier 14. The noninverting output of the buffer 14 is applied as an input signal to a first delay circuit 16 designated DELAY A which, in the exemplary embodiment, is of the order of 40 microseconds. The inverting output of the buffer 14 is applied as one input signal to an AND gate 18 the other input of which is connected to the HIGH VOLTAGE FAULT line.

The output of the delay circuit 16 is applied as one input to a three input AND gate 20. A second input of the AND gate 20 is connected to the output of the negative OR gate 6. The third input of the gate 20 is connected directly to the CONTROLLER RUN signal line. The output of the gate 20 is connected to a second delay circuit 22 identified as DELAY B. In the exemplary embodiment that delay was on the order of 0.2 seconds. The output of the B delay 22 is connected to one of the output leads labeled LV RUN. This is the low voltage enabling signal for the memory sector.

The output of the B delay 22 is also applied as one input to an AND gate 24. A second input terminal of the gate 24 is connected to the output of the A delay 16 while a third input of the gate 24 is connected to the output of the negative OR gate 6. The output of the gate 24 is connected as input to a third delay unit 26 labeled DELAY C. The output of the DELAY C 26 is connected to an output lead labeled LVC'. LVC' signifies that the signal is a low voltage confidence signal.

The HIGH VOLTAGE ENABLE signal at the input side of the Sector A logic unit 10 is connected as one input to an AND gate 28. The HIGH VOLTAGE FAULT line input to the logic unit 10 is applied as a second input to the AND gate 18, the output of which is connected as an input to a fourth delay unit 30 labeled DELAY D. The output of the D delay 30 is connected as a second input to the gate 28. In the exemplary embodiment, the delay C was on the order of 0.2 seconds and the delay D was on the order of 50 microseconds The output of the gate 28 is connected to an output lead labeled HV RUN which signifies the associated high voltage run or enable signal for the associated sector of the memory.

Operationally, let it be assumed that the input signals to the buffers 2 are functioning normally. When, however, there is a fault detected at any one of the regulator functions, there is a logical low signal appearing on the associated line. Whenever that logical low appears on one of the lines, that logical low is applied through the associated buffer 2 to the scanner and decoder/driver 4. An appropriate signal is produced at the output thereof to illuminate the proper segments of a seven-segment display unit, to identify the line in which the fault occurred.

That same low signal is applied, through the associated negative OR gate 6 or 8 to the input of the associated sector logic unit. Assume, for the purpose of discussion, that a fault occurred on the A sector +5 volt fault line. That signal will be applied to the input of the gate 6. The output of the gate 6 will apply a logical low signal to the input of the gates 20 and 24. The output of both of those gates will go to a logical low condition causing the output of DELAY B 22 to go to a logical low, turning off the LV RUN signal and, at the same time, causing the C DELAY 26 to go to a logical high. The LVC signal is normally a logical low. In the exemplary embodiment of the present invention, the HIGH VOLTAGE ENABLE input signal to the logic unit 10 is derived from the LVC' signal. Thus, when the LVC' goes to a logical high, the input signal to the gate 28 goes to a logical high disabling that gate thereupon turning off the high voltage run signal. The 0.2 second delay through both the B delay 22 and the C delay 26 provides a time interval for accomplishing whatever salvaging may be accomplished in the memory sector following detection of an incipient fault.

The foregoing description assumes that the input signals to the sector A logic circuit 10 are all in their normal running condition with a logical high at the CONTROLLER RUN signal input, a logical low at both the LOCAL SECTOR OFF and the SEQUENCER OFF signal, a logical low at the HIGH VOLTAGE ENABLE signal and a logical high at the HIGH VOLTAGE FAULT signal. At the start-up condition, however, those signals will not be in that order. With the power regulators all operating normally, the output signal from the negative OR gates 6 and 8 will both be at a logical high. The CONTROLLER RUN signal, applied to both the sector A logic circuit 10 and the sector B logic circuit 12 will be switched to a logical high. The LOCAL SECTOR OFF and the SEQUENCER OFF signals will be switched to a logical low. The HIGH VOLTAGE ENABLE signal will be standing at a logical high as will the HIGH VOLTAGE FAULT signal. When the LOCAL SECTOR OFF signal and the SEQUENCER OFF signal are switched to a logical low, the output of the buffer 14 applied to the A delay circuit 16 produces an output logical high which is, in turn, applied to the input of the gates 20 and 24 along with the respective outputs of the negative OR gates 6 and 8. After the 40 microsecond delay at the A delay 16, the gate 20 is turned on having been enabled by the controller run signal. After the 0.2 second delay in the DELAY B circuit 22, the output is applied to the LV RUN and simultaneously applied to the third input of the gate 24, turning that gate on. After the 0.2 second delay in the DELAY C circuit 26, the logical low output LVC' signal is produced. This, in turn, causes the high voltage enable signal to go to a logical low, enabling the gate 28. The 50 microsecond delay in the D delay circuit 30 assures that there will not be a spurious enabling of the gate 28 from such signals as those that may be caused by switch contact bounce, before the LVC signal has been applied.

Assume now that the system is operating normally, and either the LOCAL SECTOR OFF or the LOCAL SEQUENCER OFF signal is switched from a low to a high condition. The inverting output of the buffer 14 will go to a logical low, disabling the gate 18. The logical low at the output of the gate 18 will, after the 40 microsecond delay in the D delay 30, turn off the HV RUN signal to the affected memory sector. The noninverted output of the buffer 14 will, after being delayed and inverted by the A delay 16, disable the gate 20. The resulting logical low will, after a 0.2 second delay by the B delay 22, turn off the LV RUN signal. Here, again, the power supply signals are removed from the memory sector in proper sequence.

As hereinbefore mentioned, the sequencing of the energization of the memory sectors has heretofore been accomplished through discrete circuitry. Such discrete circuitry involves the use of a large number of individual circuit components and requires considerable time to assemble them, thus making such sequencing apparatus expensive. Additionally, the large number of parts and the human factors involved in the assembly of such elements reduces the overall reliability of such discrete circuits. In accordance with the present invention, the sequencing is accomplished under the control of a microprocessor unit. This type of control has the advantage of greatly reducing the number of individual elements in the system, reducing the expense of the total system and accordingly increases the reliability of the system.

Figure 2:
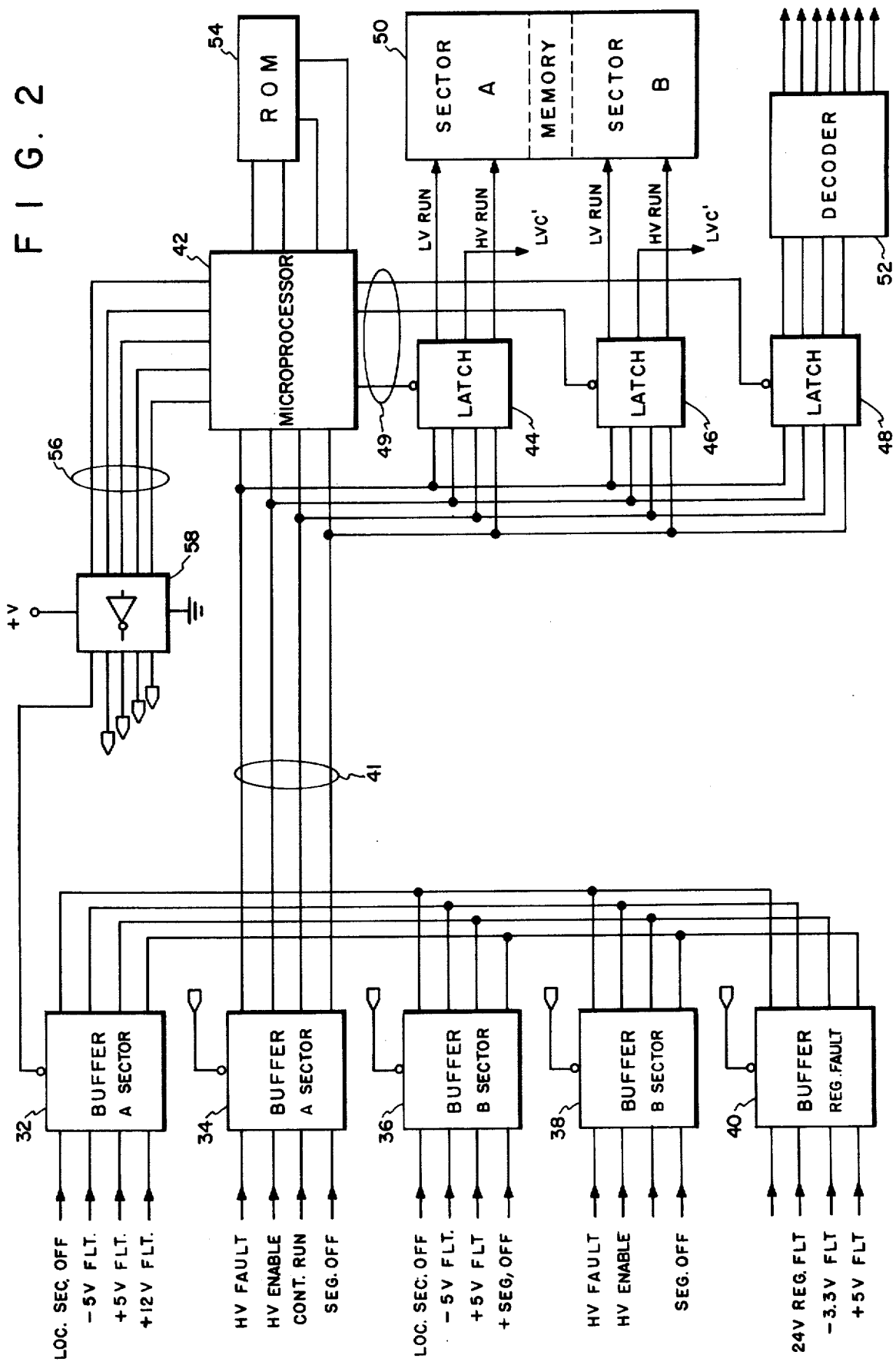
FIG. 2 is a block diagram illustrating the functional implementation of the present invention.

In order to minimize the cost of the resulting system, a relatively inexpensive microprocessor is selected. In the exemplary embodiment of the present invention, a single chip microcomputer of the type identified as Intel 8035 unit was employed. Such microprocessors, however, have a limited number of input/output (I/O) ports, lines or terminals. In accordance with the present invention, there has been provided unique circuitry to allow the microprocessor unit to communicate with up to 20 input terminals and 12 output terminals. Thd format for this unique circuitry is illustrated in FIG. 2.

As may be there seen, there is provided a first buffer unit 32, a second buffer unit 34, a third buffer unit 36, a fourth buffer unit 38, and a fifth buffer unit 40. Each of these buffer units includes four individual buffers and, in the exemplary embodiment, these buffer units comprise an integrated circuit module identified as LM 339 produced by National Semiconductor Co. Each of the buffer modules has four input terminals and four output leads corresponding respectively thereto. As may be seen, the first buffer 32 has applied thereto as input signal, signals associated with the A sector of the memory; specifically, the local SECTOR OFF signal, the −5 volt fault signal, the +5 volt fault signal and the +12 volt fault signal. Similarly, the second buffer module 34 also has signals applied thereto which relate to the operation of the A sector of the memory; specifically, the input signals thereto are the HIGH VOLTAGE FAULT signal, HIGH VOLTAGE ENABLE signal, the CONTROLLER RUN signal and the SEQUENCER OFF signal. These signals have been illustrated as input signals in connection with the discussion of FIG. 1. In a similar manner the third and fourth buffer units 36 and 38 have corresponding signals applied to the inputs thereof but related to the operation of the B sector of the memory. The fifth buffer 40 has input signals representing the 24 volt regulator fault, the −3.3 volt fault and the +5 volt fault representative of the operation of the controller regulator. The first output terminal of each of the five buffer units are wired together and connected to a first common junction. Similarly, all of the second input terminals are connected together and to a second common junction.

Again the third and fourth output terminals of each of the buffers are connected, respectively, together and to corresponding third and fourth common junctions. These common junctions are, in turn, connected by a bus 41 to corresponding input terminals of the microprocessor 42.

The aforementioned terminals of the microprocessor 42 are considered as input/output port terminals. To this end, there are four output leads connected to those same terminals, those four output leads being connected respectively in parallel to four input terminals of each of three latch modules 44, 46 and 48. While each of the three latch units 44, 46 and 48 have four output leads, in the first two latch units 44 and 46 only the first three of those leads are used in the performance of the present invention. In the third latch 48 all four of the output leads are used. The first latch 44 is connected between the output of the microprocessor 42 and the A sector of the memory 50. The output leads from the latch 44 correspond to and carry the signals LV RUN, LVC', and HV RUN. Similarly, the second latch unit 46 is connected between the output of the microprocessor 42 and the B Sector of the memory 50. Again the output leads correspond to and carry the signals LV RUN, LVC', and HV RUN.

Those signals correspond to the output signals from the Sector A logic 10 and the Sector B logic 12 illustrated in FIG. 1. The third latch 48 is connected between the output of the microprocessor 42 and a decoder 52. In the illustrative embodiment, each of the three latch units was in the form of an integrated circuit chip, each having four latches and identified commercially as a 7475 produced by Signetics. The decoder in the exemplary embodiment is also in the form of an integrated circuit module identified as a 7446 produced by Signetics. That decoder module is a binary coded decimal to seven-segement decoder, with output drivers for driving the seven segments of a seven segment display unit.

The particular microprocessor unit selected to represent the unit 42 shown in FIG. 2, does not have an internal ROM or PROM. Thus, in the exemplary embodiment an external ROM 54 is connected to the microprocessor 42 and contains the instructions for the operation of the microprocessor to effect the simulation of the sequential switching of the power supply elements. In related forms of microprocessor units which may be used to fulfill the requirements of the unit 42, the ROM is included within the structure of the microprocessor module. Such modules may be used interchangeably with the module referenced in the exemplary embodiment, without departure from the spirit and scope of the present invention.

A characteristic of the buffer assemblies 32, 34, 36, 38, and 40 is that each is supplied from an external power source. In accordance with the present invention that power source is controlled selectively by outputs from the microprocessor 42. To that end, the output leads 56 from the microprocessor are applied as input control signals to an inverter module 58. In the exemplary embodiment, the inverter module is of the type identified commercially as a 7406 produced by Signetics. Corresponding output leads from the inverter/driver 58 are applied, respectively, to the power supply input leads of the several buffer modules 32, 34, 36, 38 and 40. Similarly, the latch members 44, 46, and 48 are connected, respectively, to three other output leads 49 from the microprocessor 42 to be selectively enabled thereby.

Figure 3:
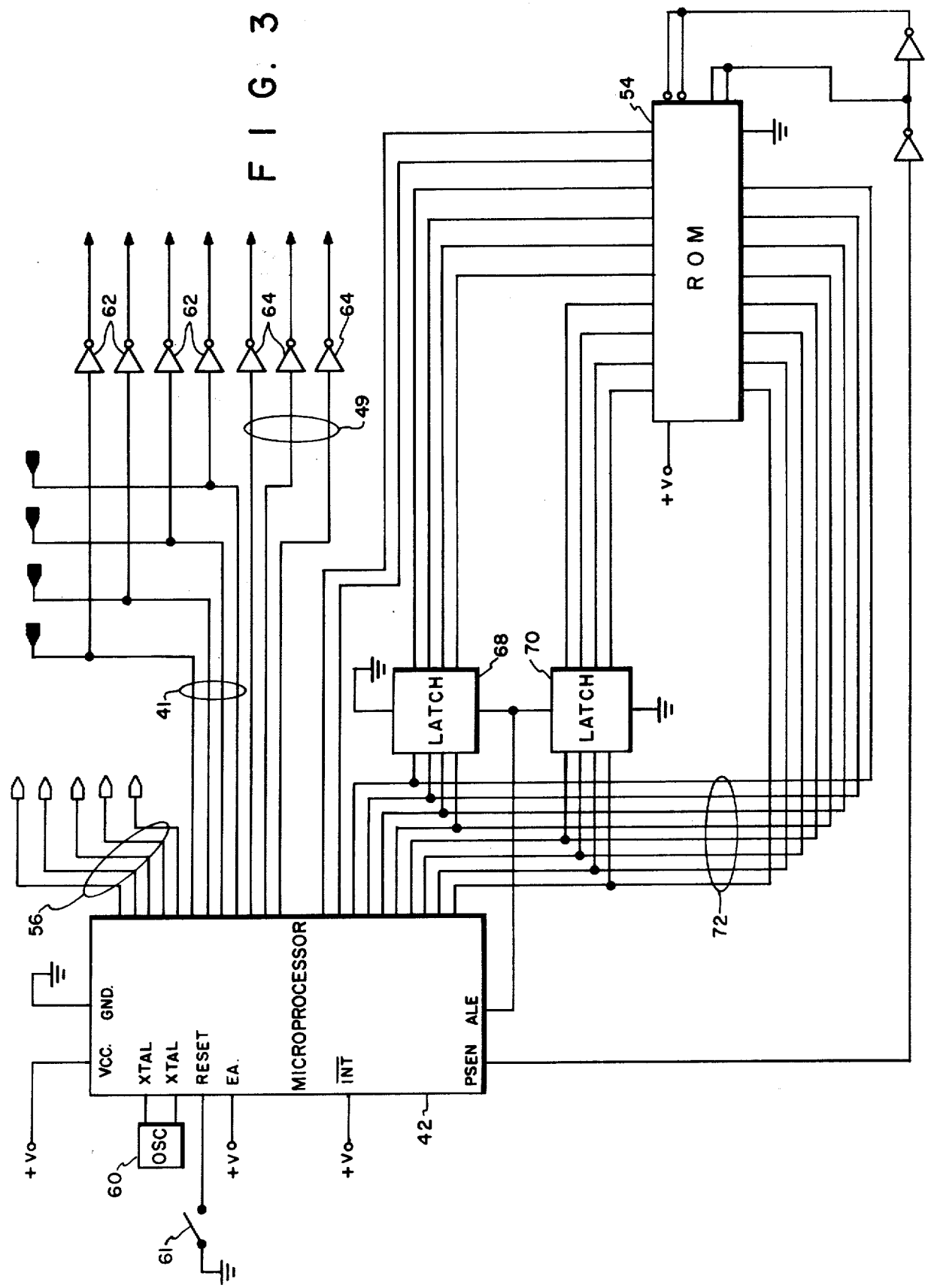
FIG. 3 is a block diagram illustrating the microprocessor together with its supporting circuitry as incorporated in the present invention.

A more detailed illustration of the microprocessor 42 and its associated supporting circuitry is shown in FIG. 3. Again the microprocessor is, in the exemplary embodiment the type 8035 module heretofore referenced. A 6 MHz crystal oscillator 60 is connected to the microprocessor to provide the basic timing for the operation thereof. A reset input terminal of the microprocessor is connected to be actuated by a manual switch 62. In the exemplary embodiment as illustrated, a logical high signal is applied to the external address terminal to enable the microprocessor to address an external memory. If the microprocessor was such as to have an internal ROM, then the signal applied to the external address terminal would be a logical low signal. A first group of output leads from the microprocessor correspond to the leads 56 illustrated in FIG. 2. It is the signal on these leads which, after inversion by the inverter 58, selectively enable the buffers 32 through 40 respectively. The next four leads in order of appearance in FIG. 3, are the so-called data input/output leads. It is on these leads that data from the buffers 32 through 40 are received by the microprocessor and it is by these same leads that data is output from the microprocessor, through the inverters 62 to the input terminals of the latches 44, 46 and 48 illustrated in FIG. 2. The next three leads in the order of illustration in FIG. 3 correspond to the leads 49 illustrated in FIG. 2 which, after inversion by the inverters 64 are applied to selectively enable the latches 44, 46 and 48. The next ten lines, in the order shown in FIG. 3 are input/output lines which are connected to the ROM 54. The first two lines represent the two least significant bits and are connected directly to the ROM 54. The next eight lines are all passed through a pair of latch members 68 and 70 to the address terminals of the ROM 54. The same eight terminals are also connected to the eight output terminals of the ROM 54. An output terminal from the microprocessor 42 is labeled ALE and is indicative of an address latch enable signal which, when active, enables the latches 68 and 70. Similarly an output terminal of the microprocessor labeled PSEN, representing a program store enable signal is connected to the output enable terminals of the ROM 54.

Operationally, the ROM 54 is loaded with the instructions for the control of the microprocessor 42. The instructions stored in the ROM 54 are addressed by the microprocessor through the operation of the latch elements 68 and 70. The instructions located at the specified addresses is returned to the microprocessor through the leads 72. Under the control of those instructions, the microprocessor sequentially energizes the separate ones of the leads 56, thereby sequentially enabling the buffers 32, 34, 36, 38 and 40. Those buffers sequentially enabled, the data input to those buffers is sequentially transferred by way of the input bus 41 to the input of the microprocessor 42. At a start-up condition, the microprocessor 42 is reset by actuation of the reset switch 62. The microprocessor 42 then scans the inputs from all of the buffers 32 through 40 to determine that all are in their normal operating condition and to set the output latches to a known state. The microprocessor then institutes the delays schematically indicated in FIG. 1 to properly energize the memory 50. In accomplishing this the latches 44, 46 and 48 are selectively energized by the leads 49 from the microprocessor thereby enabling the output at the I/O bus 41 to be selectively applied through the latches 44 and 46 to effect the energization of the Sector A and Sector B of the memory 50, in accordance with the predetermined sequencing.

Continuing under the control of the microprocessor in accordance with the instructions supplied by the ROM 54, the microprocessor again scans each of the input buffers 32, 34, 36, 38 and 40 to determine if any has a fault indication or a signal indicating the sequencer off or local sector off condition. When one of those conditions occurs, the microprocessor detects that presence, effects the necessary delays in sequencing, then transfers that information to the appropriate one of the Sector A or Sector B latch 44 and 46, respectively, and selectively enables the appropriate one of those latches to effect the sequencing of the turn-off of the power supply to the indicated sector. Simultaneously, if it is a fault in one of the regulators that has been indicated, the microprocessor identifies that fault and sends the coded designation of which of the lines has carried the fault also on the I/O bus 41 to the latch 48. That latch is also selectively enabled by one of the output lines 49 from the microprocessor. When so enabled, that latch applied the coded information to the decoder 52 which, in turn translates that coded signal into the energization of the proper ones of a seven-segment indicator That indicator will show which of the several regulator components has produced the fault.

In FIG. 4 there is shown a flow diagram for the flow of information through the system in accordance with the present invention. In that figure the dotted block represents the internal operation of the microprocessor. It may be seen that the information input to the microprocessor from the several input buffer interface units is applied to an input register 74 from which the data is manipulated by the microprocessor under the control of the instructions stored in the ROM to simulate the delays and combinational logic, and to store the results of that manipulation in the delay output register 76. If there is a change in the status in the data stored in the delay output register 76 then the outputs are updated again under the control of the instructions stored in the ROM. The updated data is then transmitted to the external latches 44 and 46 to provide the indicated desired output signals for the control of the energization of the memory sectors.

The input data from the interface units are also examined by the microprocessor to determine if any of the regulator fault lines are enabled. If one of the regulator fault lines does indicate that a fault has occurred, that information is encoded and supplied to the external latch 48 and, thence to the decoder/driver 52. The decoder/driver supplies the energization for the display units 78 which, as hereinbefore noted is preferably a seven-segment indicator.

Thus there has been provided, in accordance with the present invention, an improved control network for controlling the energization or de-energization of a computer memory unit in accordance with a predetermined sequence providing monitoring of a plurality of regulator fault lines and to provide a visual indication of the occurrence of such a fault. The improved network features a smaller number of component parts and a simplified structure thereby featuring an improvement in the reliability and economics of the network.

What is claimed is:

1. A control apparatus for controlling the energization of a memory unit in accordance with a predetermined sequence in response to input energy regulator signals, said apparatus comprising:

a plurality of input signal lines;

a microprocessor having input/output port means;

first selecting means connected to be controlled by said microprocessor for sequentially connecting selected groups of said input signal lines to said input/output port means;

said microprocessor being operative to receive said input signals and to respond to changes therein to effect said predetermined sequence of output signals at said input/output port means;

a plurality of output signal lines; and second selecting means connected to be controlled by said microprocessor for connecting selected groups of said output signal lines to said input/output port means;

said output signal lines being connected whereby said output signals control the energization of said memory unit.

2. A control apparatus as set forth in claim 1 wherein said first selecting means comprises a plurality of buffer means each having a predetermined number of buffer elements, said buffer means being selectively enabled by control signals from said microprocessor.

3. A control apparatus as set forth in claim 2 wherein said input/output port means of said microprocessor includes a predetermined number of individual port lines corresponding in number to said predetermined number of buffer elements in each of said buffer means, and wherein each of said selected groups of said input signal lines correspond in number to said predetermined number with the signal lines in each of said groups being connected respectively to corresponding ones of said buffer elements in associated ones of said buffer means.

4. A control apparatus as set forth in claim 3 wherein said second selecting means comprises a plurality of output latch means, each having a predetermined number of latch elements corresponding in number to said predetermined number of input/output port lines, individual ones of said input/output port lines being connected, respectively in parallel to the input of corresponding ones of said latch elements of each of said latch means, said latch means being selectively enabled by latch control signals from said microprocessor.

5. A control apparatus as set forth in claim 4 characterized in the addition of fault display means, further output lines connected to said fault display means, and a further latch means having a similar predetermined number of latch elements with each of said latch elements being connected respectively, to corresponding ones of said input/output port lines, said further output lines being connected to said latch elements of said further latch means.

6. A control apparatus for controlling the energization of a memory unit in accordance with a predetermined sequence in response to input energy regulator signals, said apparatus comprising:

a microprocessor;

a first plurality of input signal lines;

a second plurality of input buffer means, each including a predetermined number of buffer elements, said buffer means being individually selectively enabled by buffer control signals;

means connecting each of said input lines to an associated one of said buffer elements;

said microprocessor having a first group of output port lines connected, respectively, to said buffer means for selectively supplying and applying said buffer control signals to said buffer means;

said microprocessor having a group of input/output port lines corresponding in number to said predetermined number of buffer elements in each of said buffer means;

bus means connecting the output of corresponding ones of said buffer elements of each of said buffer means together and to corresponding ones of said input/output port lines of said microprocessor;

a plurality of latch means, each including a predetermined number of latch elements corresponding in number to said input/output port lines of said microprocessor, said latch means being individually selectively enabled by latch control signals;

said bus means including means connecting the input of corresponding ones of said latch elements of each of said latch means together and to corresponding ones of said input/output port lines of said microprocessor;

said microprocessor having a second group of output port lines connected respectively, to said latch means for selectively supplying and applying said latch control signals to said latch means;

output signal means connected to the output of said latch elements for effecting the control of the energization of said memory unit;

said microprocessor including means to control the application of said buffer control signals to selectively enable said buffer means one at a time, means to receive the input signals from the selected one of said buffer means, means responsive to changes in said input signals to institute predetermined sequencing and delays in corresponding output signals, and means to control the application of said latch control signals to selectively enable said latch means one at a time.

7. A control apparatus as set forth in claim 6 and characterized by the addition of further output signal means including a display means for displaying the identity of the input signal lines upon which a change has occurred, and a further latch means having said predetermined number of latch elements with each of said latch elements being connected, respectively, to corresponding ones of said input/output port lines, said display means being connected to the output of said further latch means.

8. A control apparatus as set forth in claim 7 wherein said display means includes a signal decoder and a display unit.

* * * * *